United States Patent [19]

Gaude

[11] Patent Number: 4,602,309
[45] Date of Patent: Jul. 22, 1986

[54] CONTROL CIRCUIT FOR A BISTABLE SOLENOID

[75] Inventor: Maurice Gaude, Le Saprey en Chartreuse, France

[73] Assignee: La Telemecanique Electrique, France

[21] Appl. No.: 732,316

[22] Filed: May 9, 1985

[30] Foreign Application Priority Data

May 9, 1984 [FR] France .................... 84 07110

[51] Int. Cl.$^4$ ............................................. H01H 47/00
[52] U.S. Cl. .................... 361/210; 361/190; 361/206
[58] Field of Search ............... 361/153, 154, 186, 187, 361/190, 206, 210

[56] References Cited

U.S. PATENT DOCUMENTS

| | | | |
|---|---|---|---|
| 3,078,395 | 2/1963 | Fraipont | 361/190 X |
| 3,400,304 | 9/1968 | Ziegler | 361/190 X |
| 3,418,541 | 12/1968 | Adams | 361/210 X |
| 3,869,651 | 3/1975 | Long et al. | 361/210 |
| 4,433,357 | 2/1984 | Nishimura et al. | 361/153 X |

Primary Examiner—Michael L. Gellner
Attorney, Agent, or Firm—William A. Drucker

[57] ABSTRACT

The control circuit according to the invention consists firstly of two control terminals ($S_1$, $S_2$) to which drive pulses of at least two different types can be applied, i.e. a first pulse type (S) designed to obtain one position (S) of the solenoid and which present a first level of amplitude, and a second pulse type (R) designed to obtain a second position (R) of the solenoid and which present a second level of amplitude different from that of the pulses (S) of the first type and with the same polarity and secondly, a discrimination circuit ($R_1$, $R_2$, A) for the pulses (R, S) of these two types according to their level of amplitude, this discrimination circuit ($R_1$, $R_2$, A) being connected to a switching circuit (CS, CS', CR, CR') controlling supply of the solenoid (B). The invention is also applicable to solenoids comprising one coil as well as to solenoids having two separate coils or with a common intermediate connecting point.

15 Claims, 9 Drawing Figures

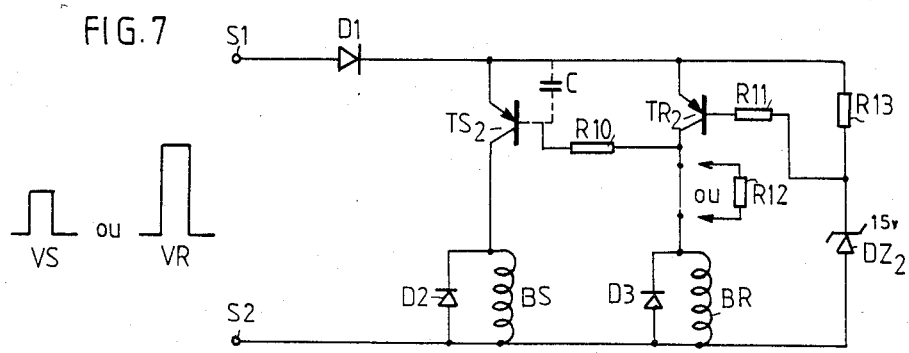
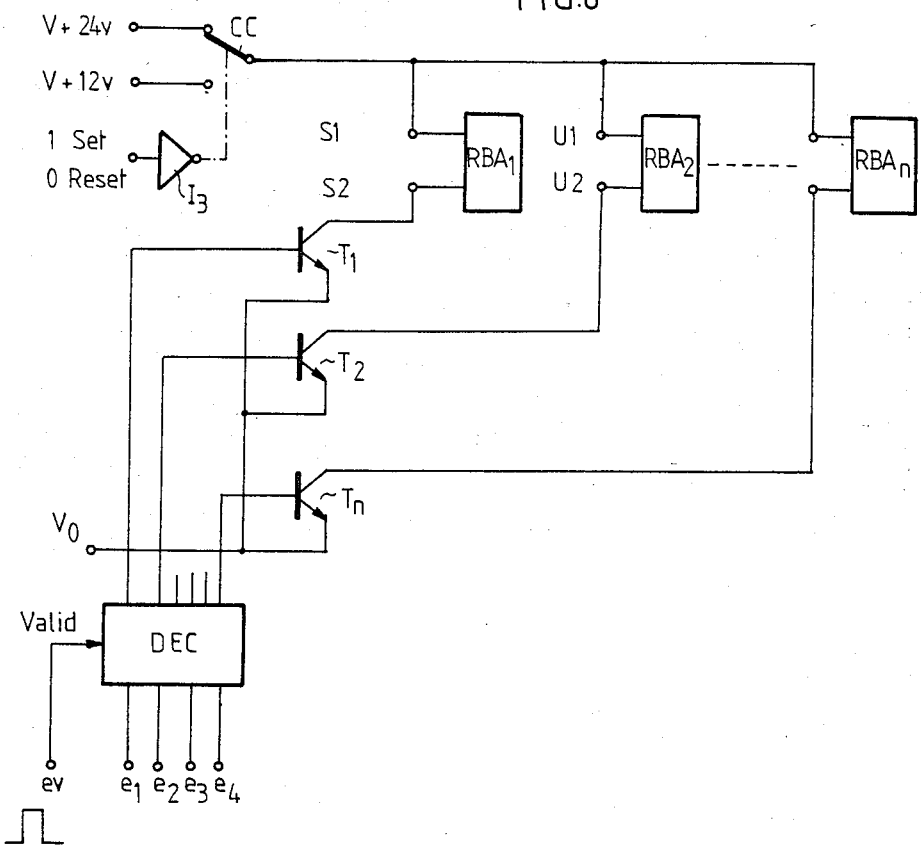

CONTROL CIRCUIT FOR A BISTABLE SOLENOID

BACKGROUND OF THE INVENTION

1. Field of the Invention

The present invention concerns a control circuit for a bistable solenoid which can be used particularly, but not exclusively, in an electromagnetic relay, in a magnetic control electromagnet, for example for clamping or releasing of a lock, or even in a bistable electrovalve.

It should be borne in mind that a bistable solenoid usually consists of a magnetic circuit acting on a mobile armature in order to lead it to one or other of the following two stable positions:
- a first position R corresponding to a maximum reluctance of the magnetic circuit, and
- a second position S corresponding to a minimum reluctance of the magnetic circuit.

These two positions are usually denoted by the terms "RESET", as regards the first, and "SET" as regards the second.

The magnetic circuit enabling these two positions to be obtained generally includes:
- a permanent magnet which polarizes the magnetic field inside the circuit, in the absence of any external field, and
- at least one coil which, when crossed by a current, creates a field which entrenches itself or is added to the one created by the magnet.

Control of these bistable solenoids is carried out using pulses, the duration of which must be sufficient in order that the mobile armature and mobile equipment connected to it take up the sought after stable position.

When the bistable solenoid includes only one coil, it is necessary to invert the polarities at the terminals of this coil so as to obtain the two sought after stable positions S and R.

On the other hand, where the solenoid includes two coils connected in series and to each other through a middle point, the pulse intended to obtain position S is applied to the terminals of one of the coils, whilst the pulse intended to obtain position R is applied to the terminals of the other coil, the middle point between the two coils capable of being permanently connected to one of the two feed coils.

DESCRIPTION OF THE PRIOR ART

These circuits, although currently used, present a certain number of drawbacks.

Where they include a single coil, they require crossing of the connections in order to obtain from the two feed wires an inversion of the current crossing the coil.

Where they include two coils with an intermediate connecting point, they introduce at least three connection terminals and two control pulse sources in order to obtain positions S and R.

Moreover, these solutions are not suitable for the realization of control circuits with a matric structure, indeed:
- the single coil solution does not enable a reverse-lock diode to be inserted inside the circuit of this coil,
- the two coil solution requires either the number of matrix lines or colums to be doubled.

OBJECT OF THE INVENTION

The aim of the invention, therefore, is to eliminate these drawbacks. It does this by proposing a control circuit for a bistable solenoid in which an active electronic control circuit is connected to the magnetic circuit unit, permanent magnet and coils so as to allow for control of the coil by the voltage pulses delivered on two wires and without polarity inversion.

SUMMARY OF THE INVENTION

According to the invention, this control circuit is particularly characterized in that it includes firstly, two control terminals to which can be applied control pulses of at least two different types, i.e. a first pulse type S designed to obtain solenoid position S, the pulses of this type presenting a first level of amplitude, and a second pulse type R designed to obtain solenoid position R, the pulses of this type presenting a second level of amplitude different to that of pulses S of the first type and with the same polarity and secondly, a discrimination circuit for pulses R, S of these two types according to their level of amplitude, this discrimination circuit being connected to a switching circuit controlling feed of the solenoid so as to obtain a minimum reluctance of the magnetic circuit in response to pulses S of the first type and a maximum reluctance in response to pulses R of the second type.

Of course, the solenoid control circuit is also applicable both to solenoids comprising one coil and those having two coils or with a common intermediate connecting point.

Moreover, according to another characteristic of the invention, the abovementioned discrimination circuit includes means for enabling the amplitude of the pulses applied to the above-mentioned control terminals to be compared in relation to three successive predetermined reference voltage zones, namely:
- a first voltage zone including the voltage level of pulses S of the first type,
- a second voltage zone including the voltage level of pulses R of the second type, and
- a third voltage zone included between the levels of the two types of pulses R, S, and where the amplitude of the said pulses must never occur.

In this case, the switching means connected to the discrimination circuit control feed of the coil in such a way as to obtain a minimum reluctance of the magnetic circuit when the amplitude of the pulses supplied by the generator is included in the first voltage zone and a maximum reluctance of the magnetic circuit when the amplitude of the pulses supplied by the generator is included in the second reference voltage zone.

BRIEF DESCRIPTION OF THE DRAWINGS

Embodiments of the invention shall be described later by means of examples which are not exclusive and with reference to the drawings annexed in which:

FIG. 7 is an embodiment of a solenoid control circuit with two coils realized according to transistor technology.

FIG. 8 is the diagram of a static switch and decoder control system.

DESCRIPTION OF THE PREFERRED EMBODIMENTS

Figure 1:
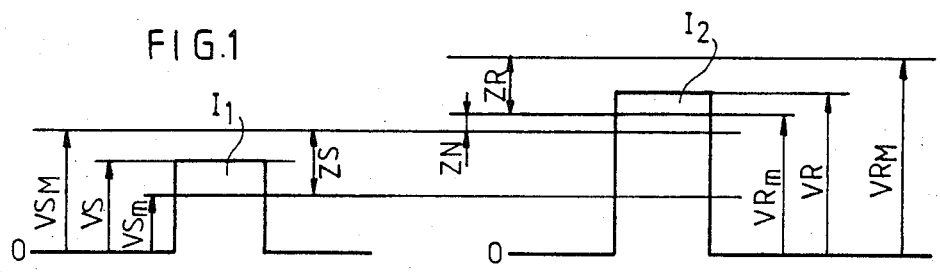
FIG. 1 is a diagram representing the form of the two types of pulses used for control of the solenoid as well as the three reference voltage zones used by the control circuit.

As previously mentioned, the control device of a bistable solenoid according to the invention requires the use of a generator allowing the delivery, on its control terminals $S_1$ and $S_2$, of pulses with two levels of amplitude, i.e. a first pulse type S to control passage of the solenoid to the stable state S and a second pulse type R to control the passage of the solenoid to stable state R. These two types of pulses are illustrated on FIG. 1 on which appear:

a pulse $I_1$ of type S which presents an amplitude VS situated in the voltage zone ZS between one voltage VSm ("Vset minimum") and one voltage $VS_M$ ("Vset maximum"), and a type R pulse $I_2$ which presents an amplitude VR situated in a voltage zone ZR included between one voltage VRm ("VReset minimum") and one voltage $VR_M$ ("VReset maximum").

The zone between voltage $VS_M$ and voltage VRm is a neutral zone ZN in which the amplitude of pulses must never be situated for, in this zone, the dicriminator may not determine for certain whether the pulse is type S or type R.

For example, the rated value of the amplitude of type S pulses $I_1$ could be equal to 12 V, the value VSm equal to 9 V and the value $VS_M$ equal to 14 V. Likewise, the rated value of the amplitude of type R pulses $I_2$ could be equal to 24 V, value VRm equal to 16 V and value $VR_M$ equal to 30 V. Zone ZS shall then have a width of 5 V, zone ZR a width of 14 V and zone ZN a width of 2 V.

Figure 2:
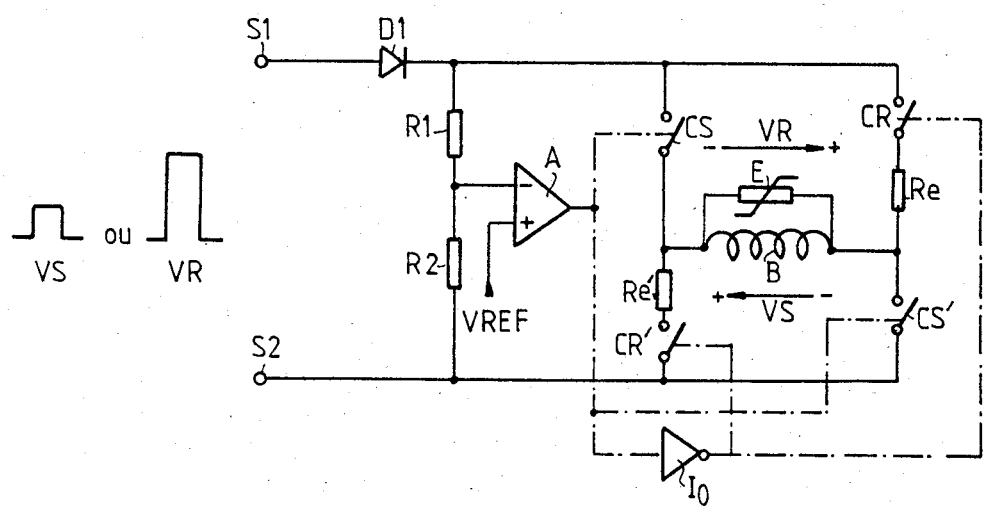
FIG. 2 is a theoretical diagram of a single coil solenoid control circuit.

In the example represented in FIG. 2, the bistable solenoid includes a single coil B connected to the control terminals $S_1$ and $S_2$ of the circuit by means of a switching circuit designed to reverse the direction of the current circulating in the coil B, according to the level of amplitude of the pulses applied to terminals $S_1$ and $S_2$.

With this end in view, each of the extremities of the coil B is connected to terminals $S_1$ and $S_2$ of the generator by means of two controllable switches, i.e. switches CS and CR' for one of the extremities of coil B and switches CR and CS' as regards the other extremity.

These switches CS, CS', CR and CR' are controlled by a discriminator type circuit including a voltage divider bridge made up of two resistances $R_1$ and $R_2$ connected in series between the two control terminals $S_1$ and $S_2$ and whose connection point is connected to the inverter terminal of a comparator A whose direct input is carried to a reference voltage VREF.

The output of this comparator A is connected firstly by a direct link to the control devices of switches CS and CS' and secondly, by means of an inverter Io to the control devices of switches CR and CR'.

Moreover, this circuit introduces a resistance R'e connected in series with the switch CR', a resistance Re connected in series with the switch CR, an amplitude limiter E connected in parallel on the coil B and a diode $D_1$ connected in the link between the control terminal $S_1$ and the unit formed by the discriminator and the switching circuit monitoring the coil B.

It should be noted that in this circuit, the voltage VSm, i.e. the minimum voltage of zone ZS, is determined by the minimum action voltage of the coil B provoking passage of the bistable solenoid to state S. As regards voltage VRm, this is determined by the value of the voltage VREF applied to the comparator.

Therefore, the functioning of this circuit can be demonstrated as follows:

where the pulse generator delivers on terminals $S_1$ and $S_2$ a voltage pulse VS, the voltage applied to the inverter input of the comparator will be lower than the reference voltage VREF with the result that the output of the comparator A will deliver a control signal (logic state 1) resulting in the closing of switches CS and CS' and, by virtue of the inverter I, the opening of switches CR and CR'. The coil B is therefore carried to a voltage VS directed initially in a first direction leading to passage of the solenoid to state S, where the pulse generator delivers a voltage impulse VR, the voltage applied to the inverter input of the comparator A will be greater than or equal to the reference voltage VREF with the result that the output of this comparator A will deliver a control signal (logic state 0) leading to the opening of switches CS and CS' and, by virtue of the inverter I, the closing of switches CR and CR'. The coil will then be carried at a voltage VR directed in a second direction leading to passage of the solenoid to state R.

The resistance Re and Re' used in the circuit previously described play two roles. First of all, they enable the switches to be protected in the event of overlapping in conduction CS, CR' or CR, CS'. Moreover, the coil B being defined to act from voltage VSm, the resistances Re and Re', which are then in series, limit the current inside the coil B when the voltage pulse VR is applied, especially when voltage VR is equel to voltage $VR_M$.

Likewise, the diode $D_1$ used also plays two roles: it ensures protection against polarity inversion and it serves as a reverse-lock diode in the case of a matric control.

Figure 3:
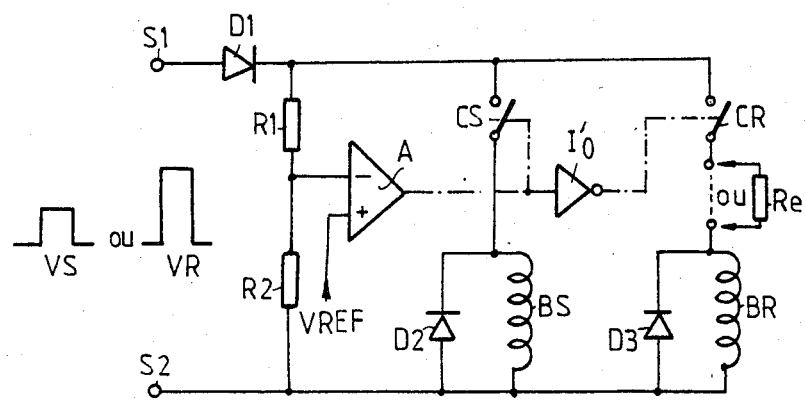
FIG. 3 is a theoretical diagram of a two coil control circuit.

The control circuit represented in FIG. 3 introduces a diode $D_1$ and a discriminator composed of the resistances $R_1$ and $R_2$ and a comparator A connected in a way identical to that of FIG. 2. However, unlike the preceding circuit, this circuit includes two coils BS and BR shunted by two respective diodes $D_2$ and $D_3$ and connected through one of their extremities to the control terminal $S_2$ and through their other extremities to the diode $D_1$ by means of two controllable switches, respectively CS and CR. In this case, the output of the comparator A is directly connected to the control device of the switch CS and, by means of an inverter I'o, to the control device of switch CR. According to this circuit, the transmission of a voltage pulse VS will provoke the closing of switch CS and the opening of switch CR with the result that only the coil BS will be fed. The solenoid will consequently pass to state S. On the other hand, the transmission of a voltage pulse VR will provoke the opening of switch CS and the closing of switch CR with the result that only coil BR will be fed. The solenoid will then pass to state R.

It should be noted that in this circuit, the voltage VSm is determined by the minimum action voltage of BS and the voltage VRm by the reference voltage VREF. However, the coil BR must be dimensioned so that its action makes the solenoid pass from state S to state R as regards a voltage of VBR less than or equal to VRm.

Preferably, the coil BR can be dimensioned in such a way as to support the voltage VRM without consuming too much current. However, in order to obtain such a current limitation, it is, if necessary, possible to arrange a resistance Re in series with the coil BR.

Figure 4:
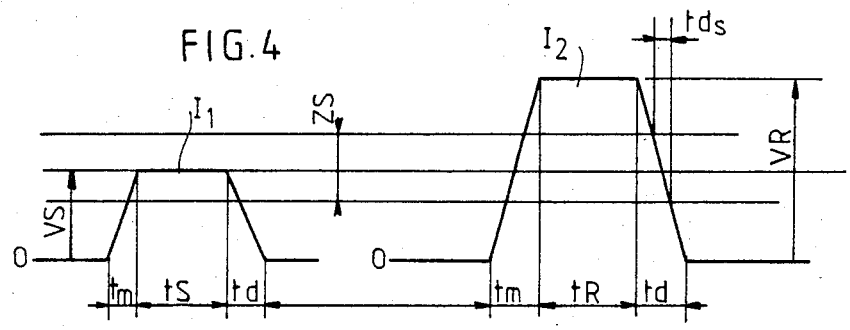
FIG. 4 is a diagram illustrating the incidence of the fall and rise times of the control pulses as regards the functioning of the circuits represented in FIGS. 2 and 3.

In the circuits illustrated in FIGS. 2 and 3, the rise time tm of type S and R pulses (FIG. 4) does not affect the functioning of these circuits.

On the other hand, the fall time td must be less than the response time of the bistable solenoid. Indeed, during the fall of the type R pulse, the voltage crosses zone ZS during a time tds.

It is essential that the passage of the bistable solenoid to state S is not activated during this period.

This result can be obtained by reducing as far as possible the fall time td and/or by increasing the response time of the bistable solenoid to a type S pulse, for example by delaying by a time constant Rc the closing of contactor CS or contactors CS and CS'.

This problem can be resolved by providing the response times of the bistable solenoid with a type S pulse (response time $t_BS$) and type R pulse (response time $t_BR$) and by providing pulse periods tS for type S and tR for type R which meet the following conditions:

$$2t_BS \leq TS \leq 3t_BS$$

$$2t_BS < tR \leq 3t_BR$$

with $$t_BS \neq \neq T_BR \sim \text{several ms}$$

$$tS \neq \neq tR \simeq 10 \text{ ms}$$

and $$td \leq \frac{tR}{10}$$

Figure 5:
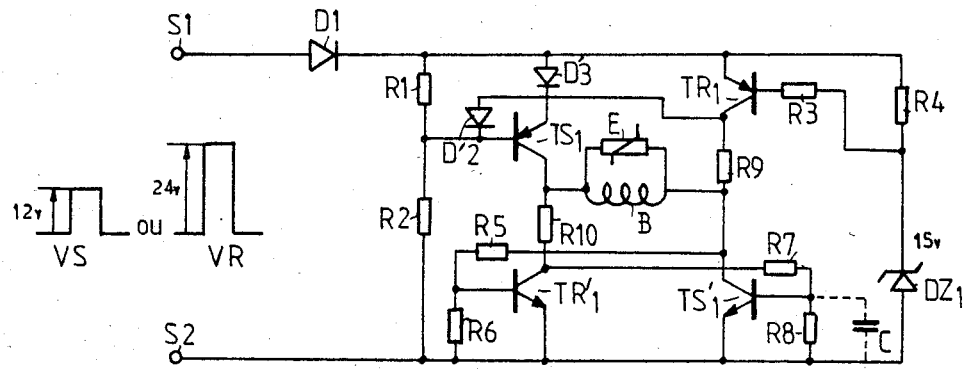
FIG. 5 is an embodiment of a solenoid control circuit with one coil realized according to transistor technology.

The control circuits illustrated in FIGS. 5 and 7 concern realization examples using a minimum number of components and, because of this, they are very economical. The bipolar transistors used in these circuits can be replaced, subject to slight modifications, by MOS power transistors. The implementation of these circuits can make use of well-known connection technologies using, for example:
- rigid or supple printed circuits,
- thick-film hybrid circuits,
- a specific integrated circuit of the Mos, C Mos or bipolar (CUSTOM) type.

The circuit illustrated in FIG. 5 applies to a solenoid with a single coil B and presents a structure similar to that of the circuit shown on FIG. 2. Consequently, this circuit similarly includes a diode $D_1$, a voltage divider bridge $R_1$, $R_2$, four transistors $TS_1$, $TS'_1$, $TR_1$, $TR'_1$ respectively playing the role of controllable switches CS, CS', CR, CR', resistances $R_9$ and $R_{10}$, similar to resistances Re and Re' which are mounted in the circuits connecting the collectors of transistors TR' and TR to the two extremities of the coil B, and an amplitude limiter E connected in parallel on the coil B.

The transistors $TS_1$ and $TR_1$ are type PNP and their transmitters are connected to the diode $D_1$, directly as regards transistor $TR_1$ and by means of a diode $D_3$ as regards transistor $TS_1$.

Transistors $TR'_1$ and $TS'_1$ are type NPN and are connected by their transmitter to control terminal $S_2$. The collectors of transistors $TS_1$ and $TS'_1$ are respectively connected to the two extremities of coil B.

The base of transistor $TS_1$ is connected to the connection point of resistances $R_1$ and $R_2$ of the voltage divider bridge as well as to the collector of transistor $TR_1$ by means of a diode $D'_2$.

The base of transistor $TR_1$ is connected by means of a resistance $R_3$ to the connection point of a resistance $R_4$ itself connected to the diode $D_1$ and of a Zener (breakdown) diode $DZ_1$ of, for example, 15 volts and whose anode is connected to control terminal $S_2$.

The base of transistor $TR'_1$ is connected to the connection point of two resistances $R_5$ and $R_6$ which constitute a voltage divider bridge between the collector of transistor $TS'_1$ and the control terminal $S_2$.

The base of transistor $TS'_1$ is connected to the connection point of two resistances $R_7$ and $R_8$ which constitute a voltage divider bridge between the collector of transistor $TR'_1$ and the control terminal $S_2$. A capacitor C designed to delay by a time constant conduction of the transistor $TS'_1$ is mounted in parallel on the resistance $R_8$. According to this circuit, when the pulse generator delivers a type S pulse, e.g. of 12 volts, the transistor $TS_1$ whose base is polarized by the bridge $R_1$, $R_2$ becomes a conductor and then, after the loading of the capacitor C, transistor $TS'_1$, whose base is polarized by the circuit including diode $D'_3$, transistor $TS_1$ and resistances $R_{10}$, $R_7$ and $R_8$ also becomes conductor.

Due to the conduction of transistor $TS'_1$, the transistor $TR'_1$ is kept in a blocked state. The same is true for transistor $TR_1$ whose base is carried at a voltage close to its transmitter voltage.

The coil B is then crossed by a current which circulates in a first direction suitable for leading the bistable solenoid to state S.

On the other hand, when the pulse generator delivers a type R pulse of, for example, 24 volts, the base/transmitter potential difference of transistor $TR_1$ which is then about 9 volts by virtue of the Zener diode $DZ_1$, is sufficient to provoke the conduction of transistor $TR_1$. This conduction results in the blockage, thanks to diode $D'_2$, of transistor $TS_1$ and, by means of the circuit including resistances $R_9$, $R_5$ and $R_6$, conduction of transistor $TR'_1$. The coil B is then crossed by a current which circulates in a second direction suitable for leading the bistable solenoid to state R.

It thus appears that in this realization mode, the voltage VRm is determined by the Zener didoe $DZ_1$.

Figure 6:
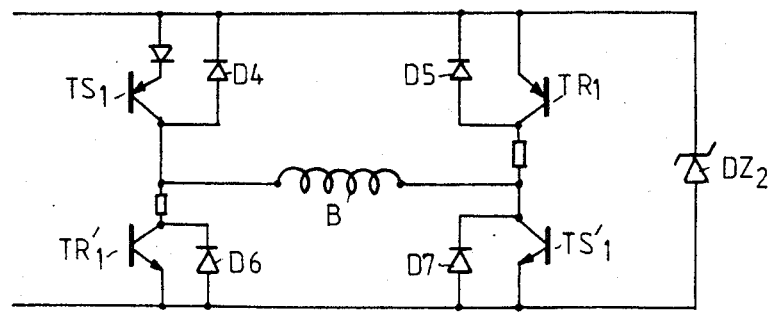
FIG. 6 is a partial diagram of a control circuit of the type represented by FIG. 2 but in which the amplitude limiter is realized in a different manner.

Of course, the invention is not limited to the realization modes previously described. Thus, for example, the amplitude limiter E could be replaced, as shown on FIG. 6, by four diodes $D_4$, $D_5$, $D_6$ and $D_7$ mounted in antiparallel fashion on transistors $TS_1$, $TS'_1$ and $TR_1$, $TR'_1$ and a Zener diode $DZ_2$ connected between diode $D_1$ and the control terminal $S_2$.

The circuit illustrated in FIG. 7 includes two coils BS and BR connected to the feed terminals by means of two transistors $TS_2$ and $TR_2$ respectively and a common diode $D_1$. The base of transistor $TS_2$ is connected to its transmitter by means of a capacitor C and to the collector of transistor $TR_2$ by means of a resistance $R_{10}$. The base of transistor $TR_2$ is connected to the connection point of a resistance $R_{13}$ connected to the collectors of transistors $TS_2$ and $TR_2$ and of a Zener diode $DZ_2$ connected to the control terminal $S_2$.

In the circuit connecting the collector of transistor $TR_2$ to the coil $B_R$, a resistance $R_{12}$ may also be disposed.

Therefore, when the pulse generator delivers a type S pulse, transistor $TS_2$ becomes a conductor after a slight delay time (polarization of its base by the circuit C, $R_{10}$, BR) whilst the transistor $TR_2$ remains blocked due to the voltage of the pulse being less than the threshold voltage of the Zener diode $DZ_2$. Only the coil BS will be crossed by a current.

On the other hand, when the pulse generator delivers a type R pulse, the transistor $TR_2$ becomes a conductor and provokes the blockage of transistor $TS_2$ (polarization of the base by $R_{13}$, $DZ_2$ and $R_{11}$). Only the coil BR will then be crossed by a current.

As mentioned previously, the control circuits according to the invention can favorably equip bistable relays usable in conventional control circuits.

FIG. 8 shows an example of the realization of a decoder and static switch control circuit which includes a plurality of active bistable relays $RBA_1$, $RBA_2$ . . . $RBA_n$. These relays each use a control circuit not represented as those previously described which each present two control terminals.

The terminals S1 of these relays are connected to a type S and R pulse generator which includes, in conventional fashion, a switch CC connected to two voltage sources, one to a voltage of V+12 volts as regards type S pulses and the other of V+24 volts for type R pulses, and controlled by an inverter circuit $I_3$ receiving a two level logic signal, i.e. a type S logic signal (for example of level 1) and a type R logic signal (for example of level 0).

The terminals $S_2$ of relays RBA . . . $RBA_n$ are connected to a reference voltage source $V_o$, for example the earth (ground), by means of respective transistors $T_1$, $T_2$ . . . $T_n$, the bases of which are monitored by a decoder DEC. This decoder DEC includes a logic input, e.g. with four terminals $e_1$, $e_2$, $e_3$, $e_4$ and a validation input ev and which enables in particular the period to be defined for pulses applied to the bistable relays $RBA_1$, $RBA_2$ . . . $RBA_n$.

Thus, for a defined logic combination applied to inputs $e_1$, $e_2$, $e_3$ and $e_4$ of the decoder DEC and during the pulse validation period, a corresponding bistable relay RBA will be subjected to a pulse, the type of which will be defined by the logic level applied to the switch CC.

Figure 9:
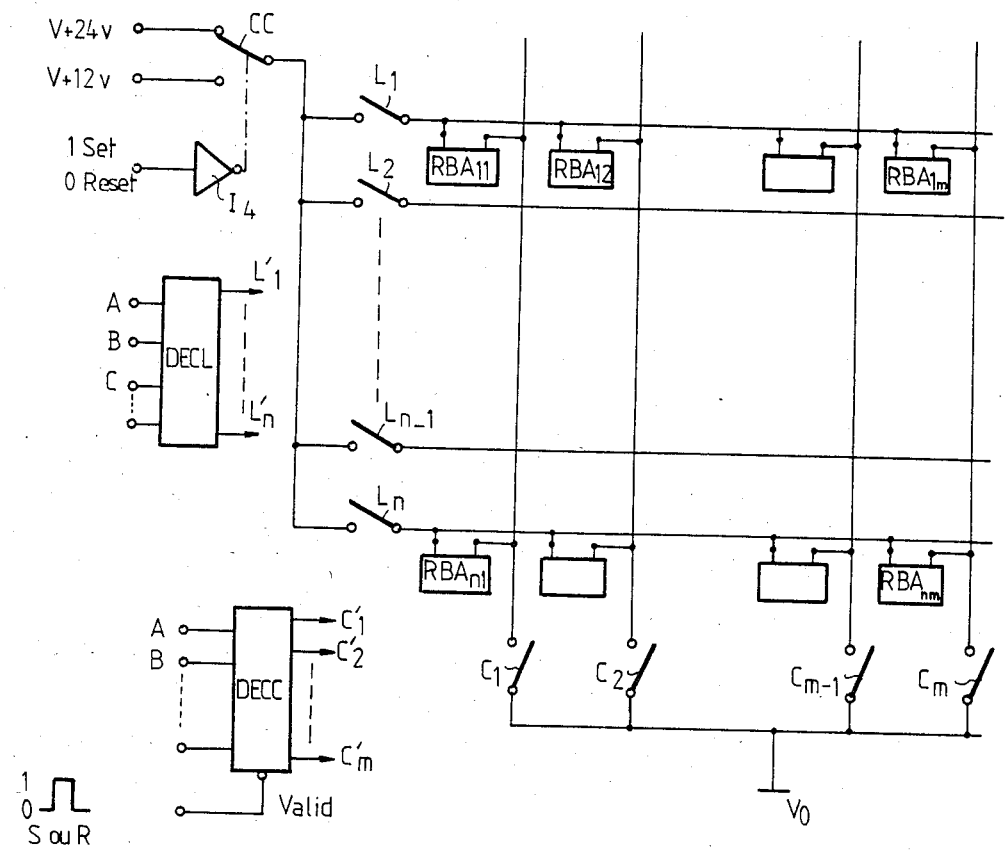
FIG. 9 is the diagram of a matric type control system.

FIG. 9 illustrates an example of the application of the invention to the realization of a matric control system.

This system includes, in a conventional way, a meshed conductor network with n lines and m columns at the intersections of which are connected, in a conventional way, the active bistable relays:

$RBA_{11}$ . . . $RBA_{1m}$
.   .
.   .
$RBA_{n1}$ . . . $RBA_{nm}$

Each of the lines of this network is connected, by means of a switch $L_1$, $L_2$ . . . $L_{n-1}$, $L_n$, to a type S and R pulse generator which conventionally includes a switch CC connected to two voltage sources, one at V+12 volts for type S pulses and the other of V+24 volts for type R pulses. This switch is controlled by an inverter $I_4$ receiving a two level logic signal, i.e. a type S logic signal (e.g. of level 1) and a type R logic signal (e.g. of level 0).

Moreover, the columns of this network are connected to the reference voltage $V_o$, for example OV, by means of switches $C_1$, $C_2$ . . . $C_{m-1}$, $C_m$.

The line switches $L_1$, $L_2$ . . . $L_{n-1}$, $L_N$ are monitored by a line decoder DECI which includes as many outputs $L'_1$, $L'_2$ . . . $L'_n$ as there are switches $L_1$, $L_2$ . . . $L_n$.

In the same way, the column switches $C_1$, $C_2$ . . . $C_n$ are monitored by a column decoder DECC which includes as many outputs $C'_1$, $C'_2$ . . . $C'_n$ as there are switches $C_1$, $C_2$ . . . $C_n$.

These lines decoders DECL and column decoders DECC respectively receive on their inputs line and column addressing logic signals.

Moreover, the column decoder DECC includes a validation input ev which enables the type S and type R pulse time applied to the bistable relays RBA to be defined.

Consequently, for a given line address applied to the line decoder and for a given column address applied to the address decoder and during the period of the validation signal, a bistable relay of the network will be activated according to the state of the switch CC by a type S or type R signal.

It should be noted that in this type of application, reverse-lock diodes $D_1$ must be provided in each bistable relay RBA.

The advantage of the system previously described lies in the fact that it can introduce a large number of on/off relays. It is therefore particularly suitable in the field of industrial process automation.

What is claimed is:

1. Control circuit for a bistable solenoid of the type including a magnetic circuit comprising a permanent magnet which polarizes the magnetic field inside the circuit in the absence of any external field, and at least one coil (B) which, when crossed by a current, creates a field which entrenches itself or is added to the one created by the magnet in such as way as to lead a mobile device alternately into two stable positions (R) and (S) corresponding to a maximum reluctance and a minimum reluctance of the magnetic circuit, characterized in that it includes firstly, two control terminals ($S_1$, $S_2$) to which can be applied control pulses of at least two different types, i.e. a first pulse type (S) designed to obtain position (S) of the solenoid and which present a first level of amplitude, and a second pulse type (R) designed to obtain position (R) of the solenoid and which present a second level of amplitude different from that of pulses (S) of the first type and with the same polarity and secondly, a discrimination circuit ($R_1$, $R_2$, A) for pulses (R, S) of these two types according to their level of amplitude, this discrimination circuit ($R_1$, $R_2$, A) being connected to a switching circuit (CS, CS', CR, CR') controlling feed of the solenoid in such a way as to obtain a minimum reluctance of the magnetic circuit in response to pulses (S) of the first type and a minimum reluctance in response to pulses (R) of the second type.

2. Control circuit according to claim 1 characterized in that the above-mentioned discrimination circuit ($R_1$, $R_2$, A) includes means (A) enabling the amplitude of pulses applied to the terminals ($S_1$, $S_2$) to be compared with three successive predetermined reference voltage zones, namely:
a first voltage zone including the voltage level of pulses (S) of the first type,
a second voltage zone including the voltage level of pulses (R) of the second type, and
a third voltage zone included between the levels of the two types of pulses (R, S) and in which the amplitude of the said pulses must never be situated,
and
in that the said discrimination circuit ($R_1$, $R_2$, A) acts on the switching means (CS, CS', CR, CR') controlling feed of the coil (B) in such a way as to obtain a minimum reluctance of the magnetic circuit when the amplitude of the pulses applied to the terminals ($S_1$, $S_2$) is included in a first voltage zone and a maximum reluctance of the magnetic circuit when the amplitude of the pulses applied to the terminals ($S_1$,$S_2$) is included in the second reference voltage zone.

3. Control circuit for a bistable solenoid comprising a single coil (B),
characterized in that the said coil (B) is connected to the control terminals ($S_1$, $S_2$) of the circuit by means of a switching circuit (CS, CS', CR, CR') suitable for inverting the direction of the current circulating inside the coil (B), according to the level of pulses.

4. Control circuit according to claim 3,
characterized in that the said switching circuit includes a first and second controllable switch (CS, CR') respectively connecting one of the extremities of the coil (B) to two control terminals ($S_1$, $S_2$) of the circuit and a third and fourth controllable switch (CR and CS') respectively connecting the other extremity of the coil (B) to the two terminals ($S_1$, $S_2$), and
in that the said switches (CS, CS', CR, CR') are controlled by a discriminator circuit including a voltage divider bridge constituted by two resistances ($R_1$, $R_2$) connected in series between the two control terminals ($S_1$, $S_2$) and whose connection point is connected to the input of a comparator (A) which compares the voltage at the said connection point with a reference voltage (VREF), the output of this comparator (A) being connected firstly by direct link to the control devices of the first and fourth control switches (CS, CS') and secondly by means of an inverter circuit ($I_o$) to the control devices of the second and third switches (CR) and (CR').

5. Control circuit according to claim 4,
characterized in that it includes in addition the resistances ($R'e$) and (Re) respectively connected in series with the second and third switches (C'R) and (CR).

6. Control circuit according to one of claims 1 and 3, characterized in that it includes in addition an amplitude limiter (E) mounted in parallel on the coil (B).

7. Control circuit according to one of claims 1 and 3,
characterized in that it includes a first diode ($D_1$) mounted in the link between one ($S_1$) of the two control terminals and the unit formed by the discriminator and switching circuit monitoring the coil (B).

8. Control circuit according to claim 4 in which the above-mentioned controllable switches (CS, CS', CR, CR') consist of first, second, third and fourth transistors ($TS_1$, $TS'_1$, $TR_1$, $TR'_1$), characterized in that:
the first transistor ($TS_1$) is the PNP type and has its emitter connected to the first diode ($D_1$) by means of a second diode ($D'_3$),
the third transistor ($TR_1$) is type PNP and has its emitter connected directly to the first diode ($D_1$),
the second and fourth transistors ($TS'_1$) and ($TR'_1$) are type NPN and are connected by their emitters to the control terminals ($S_2$) of the circuit,
the collectors of the first and third transistors ($TS_1$) and ($TS'_1$) are respectively connected to the extremities of the coil (B),
the collectors of the second and fourth transistors ($TR_1$) and ($TR'_1$) are connected respectively to the two extremities of the coil (B) by two respective resistances ($R_9$, $R_{10}$),
the base of the first transistor ($TS_1$) is connected to the connection point of the resistances ($R_1$, $R_2$) of the above-mentioned voltage divider bridge as well as to the collector of the third transistor ($TR_1$) by means of a third diode ($D'_2$),
the base of the third transistor ($TR_1$) is connected by means of a resistance ($R_3$) to the connection point of a resistance ($R_4$) itself connected to the diode ($D_1$) and of a Zener diode ($DZ_1$), whose anode is connected to the control terminal ($S_2$),
the base of the second transistor ($TS'_1$) is connected to the connection point of two resistances ($R_7$) and ($R_8$) which constitute a voltage divider bridge between the collector of the fourth transistor ($TR'_1$) and the control terminal ($S_2$),
a capacitor (C) is mounted in parallel on the resistance ($R_8$).

9. Control circuit according to claim 4,
characterized in that the above-mentioned amplitude limiter consists of four diodes ($D_4$, $D_5$, $D_6$) respectively mounted in antiparallel fashion on the above-mentioned first, second, third and fourth transistors ($TS_1$, $TS'_1$, $TR_1$, $TR'_1$).

10. Control circuit for a bistable solenoid comprising two coils (BS, BR),
characterized in that these two coils ($B_1$, $B_2$) are connected to the terminals ($S_1$, $S_2$) of the circuit by means of a switching circuit suitable for feeding one or other of the coils (BS, BR) according to the level of pulses applied to the control terminals ($S_1$, $S_2$).

11. Control circuit according to claim 10,
characterized in that the above-mentioned switching circuit includes two controllable switches (CS) and (CR) respectively connected in series with the coils (BS) and (BR) and in that the said controllable switches (CS) and (CR) are controlled by a discriminator circuit including a voltage divider bridge constituted by two resistances ($R_1$, $R_2$) connected in series between the two control terminals ($S_1$, $S_2$) and whose connection point is connected to the input of a comparator (A) which compares the voltage at the said connection point with a reference voltage (VREF), the output of this comparator (A) being connected firstly by a direct link to the control device of one of the two controllable switches (CS) and secondly to the control device of the other controllable switch (CR) by means of an inverter ($I'o$).

12. Control circuit according to claim 10, characterized in that a diode ($D_2$, $D_3$) is mounted in parallel on each of the coils (BR, BS).

13. Control circuit according to claim 10, characterized in that a resistance (Re) is connected in series with the coil (BR).

14. Control circuit according to claim 10, characterized in that it includes a diode ($D_1$) mounted in the link between one ($S_1$) of the two control terminals and the unit formed by the discriminator and the switching circuit monitoring the coils (BS) and (BR).

15. Control circuit according to claim 10, characterized in that the two above-mentioned coils (BS) and (BR) are connected to the above-mentioned control terminals by means of two transistors ($TS_2$) and ($TR_2$) respectively and a common diode ($D_1$), and in that the base of the transistor ($TS_2$) is connected to its emitter by means of a capacitor (C) and to the collector of the transistor ($TR'_2$) by means of a resistance ($R_{10}$) and in that the base of the transistor ($TR_2$) is connected to the connection point of a resistance ($R_{13}$) connected to the collectors of transistors ($TS_2$) and ($TR_2$) and of a Zener diode ($DZ_2$) connected to the control terminal ($S_2$).

* * * * *